United States Patent
Wen et al.

(10) Patent No.: US 10,910,469 B2
(45) Date of Patent: Feb. 2, 2021

(54) SEMICONDUCTOR DEVICE WITH CONDUCTING STRUCTURE FOR REDUCING PARASITIC CAPACITANCE AND IMPROVING RC DELAY

(71) Applicant: Vanguard International Semiconductor Corporation, Hsinchu (TW)

(72) Inventors: Wen-Hua Wen, Taoyuan (TW); Chia-Shen Liu, Hsinchu (TW); Wen-Chung Chen, Changhua County (TW); Chrong-Jung Lin, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 16/435,102

(22) Filed: Jun. 7, 2019

(65) Prior Publication Data
US 2020/0388676 A1 Dec. 10, 2020

(51) Int. Cl.
*H01L 29/06* (2006.01)
*H01L 21/762* (2006.01)
*H01L 29/423* (2006.01)
*H01L 29/08* (2006.01)
*H01L 29/78* (2006.01)

(52) U.S. Cl.
CPC .... *H01L 29/0653* (2013.01); *H01L 21/76224* (2013.01); *H01L 29/0847* (2013.01); *H01L 29/42356* (2013.01); *H01L 29/78* (2013.01)

(58) Field of Classification Search
CPC .......... H01L 21/76224; H01L 29/0847; H01L 29/0653; H01L 29/78; H01L 29/42356
See application file for complete search history.

(56) References Cited

U.S. PATENT DOCUMENTS

| 8,288,244 B2 | 10/2012 | Collins |
| 9,793,348 B2 | 10/2017 | Sonsky |
| 10,553,687 B2 * | 2/2020 | Chen ................ H01L 29/42368 |
| 2015/0364576 A1 | 12/2015 | Zhang et al. |
| 2016/0155797 A1 * | 6/2016 | Zhang ............... H01L 21/76224 257/336 |

FOREIGN PATENT DOCUMENTS

| CN | 109560079 A | 4/2019 |
| TW | 201027630 A1 | 7/2010 |
| TW | I460819 B | 11/2014 |

OTHER PUBLICATIONS

Taiwanese Office Action and Search Report dated Apr. 9, 2020 for Application No. 108111809.

* cited by examiner

*Primary Examiner* — Quoc D Hoang
(74) *Attorney, Agent, or Firm* — Birch, Stewart, Kolasch & Birch, LLP

(57) ABSTRACT

A semiconductor device includes a substrate and a conducting structure. The substrate has a first conductivity type and includes a first isolation region, a first implant region, and a second implant region. The first isolation region is disposed along the circumference of the substrate. The first implant region has the first conductivity type, and the second implant region has a second conductivity type that is the opposite of the first conductivity type. The conducting structure is disposed on the substrate, and at least a portion of the conducting structure is located on the first isolation region.

18 Claims, 8 Drawing Sheets

SEMICONDUCTOR DEVICE WITH CONDUCTING STRUCTURE FOR REDUCING PARASITIC CAPACITANCE AND IMPROVING RC DELAY

BACKGROUND

Technical Field

Embodiments of the present disclosure relate to a semiconductor device, and in particular they relate to a semiconductor-on-insulator (SOI) device.

Description of the Related Art

Semiconductor devices may be widely used in various applications. For example, semiconductor devices can be used as rectifiers, oscillators, illuminators, amplifiers, photometers, and so on.

As technology advances, the semiconductor industry has developed a semiconductor-on-insulator (SOI) device, which may have an integrated circuit (IC) that makes it easier to boost the clock, that reduces current leakage to save power, and that has the advantage of having some masks that may be omitted from the manufacturing process, thereby reducing the cost.

However, existing semiconductor-on-insulator (SOI) devices are not satisfactory in every respect. For example, the connections of polycrystalline silicon on the active region of the semiconductor device may create additional parasitic capacitance, causing resistor-capacitor delay (RC delay) in the integrated circuit on the conductive lines.

SUMMARY

In accordance with some embodiments of the present disclosure, a semiconductor device includes a substrate and a conducting structure. The substrate has a first conductivity type and includes a first isolation region, a first implant region, and a second implant region. The first isolation region is disposed along the circumference of the substrate. The first implant region has the first conductivity type, and the second implant region has a second conductivity type that is the opposite of the first conductivity type. The conducting structure is disposed on the substrate, and at least a portion of the conducting structure is located on the first isolation region.

In accordance with some embodiments of the present disclosure, a semiconductor device includes a substrate and a conducting structure. The substrate includes a first isolation region, a second isolation region, a first implant region, and a second implant region. The first isolation region is disposed along the circumference of the substrate. The second isolation region is disposed inside a region enclosed by the first isolation region, and the second isolation region is separated from the first isolation region. The first implant region is disposed adjacent to the second isolation region. The second implant region is disposed adjacent to the second isolation region and the first implant region. The conducting structure is disposed on the substrate, and at least a portion of the conducting structure is located on the first isolation region and the second isolation region.

BRIEF DESCRIPTION OF THE DRAWINGS

Aspects of the embodiments of the present disclosure can be understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
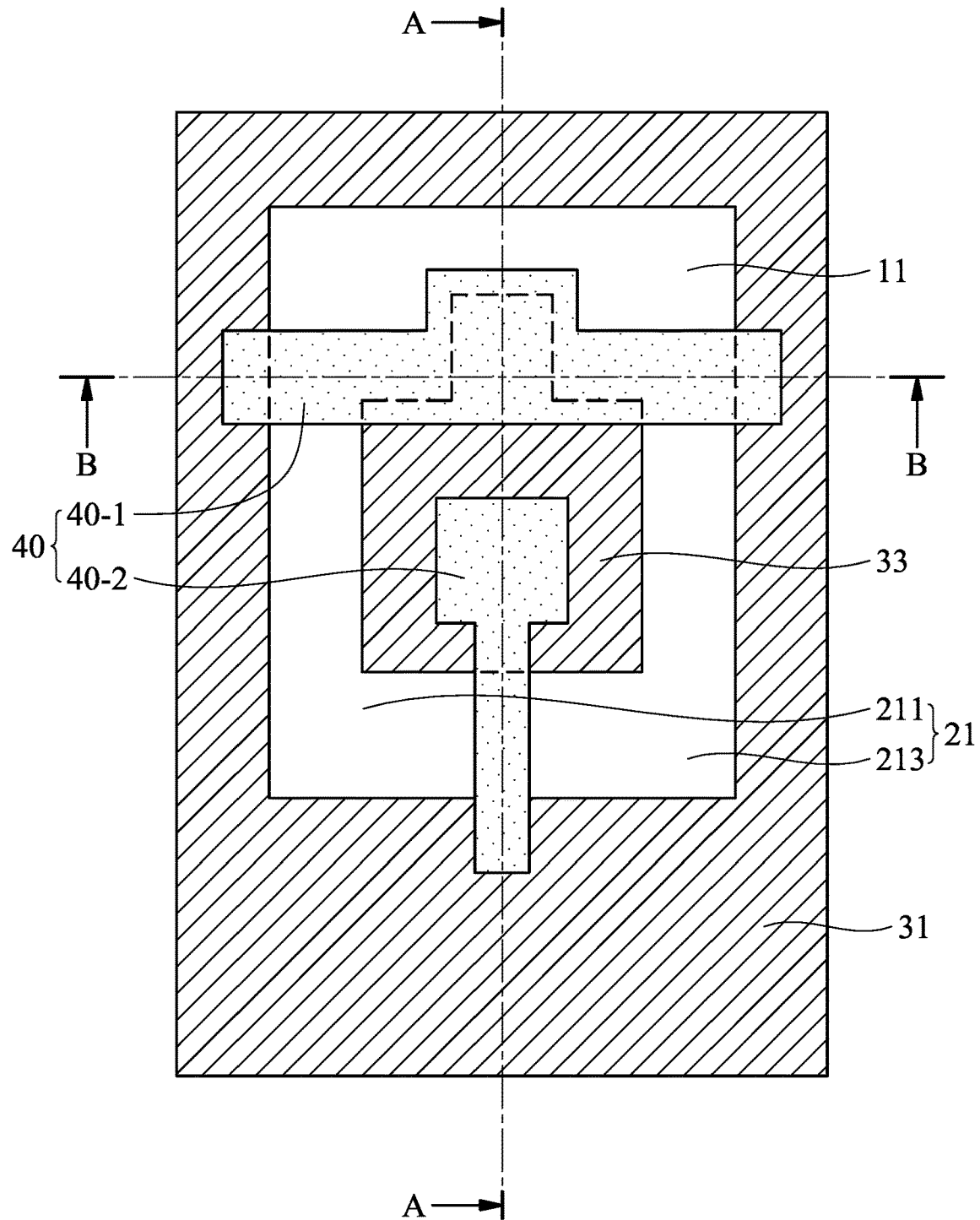
FIG. 1 is a partial top view illustrating a semiconductor device according to one embodiment of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, so that the first and second features may not be in direct contact.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 45 degrees or at other orientations) and the spatially relative descriptors used herein may likewise be interpreted accordingly.

In the present disclosure, the terms "about" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. That is, when there is no specific description of the terms "about" and "substantially", the stated value includes the meaning of "about" or "substantially".

It should be understood that, although the terms "first," "second," "third," etc. can be used herein to describe various elements, components, regions, layers and/or sections, these elements, components, regions, layers and/or sections should not be limited through these terms. These terms are only used to distinguish one element, component, region, layer or section from another region, layer or section. Thus, a first element, component, region, layer or section discussed below could be termed a second element, component, region, layer or section without departing from the teachings of the present disclosure.

Unless otherwise defined, all terms (including technical and scientific terms) used herein have the same meaning as commonly understood through one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

Furthermore, the elements in the drawings are merely illustrative, and the dimensions (including length, width, or height) of the elements should not be limited in the drawings. Furthermore, the semiconductor device described in the present disclosure may include a display device, a light-emitting device, a detecting device, a touch device, or other suitable device, but the disclosed embodiments are not limited thereto.

In the semiconductors according to the embodiments of the present disclosure, a plurality of electrodes (e.g., source/drain electrodes, bulk electrode) may be separated from each other by the conducting structure (which including conductive layers and dielectric layers), and a portion of the conducting structure may be disposed on the isolation region (e.g., deep trench isolation (DTI) structure), such that the parasitic capacitance may be effectively reduced and the RC delay of the conductive lines may be improved. The following description will be made with reference to the embodiments shown in the drawings.

Figure 2:
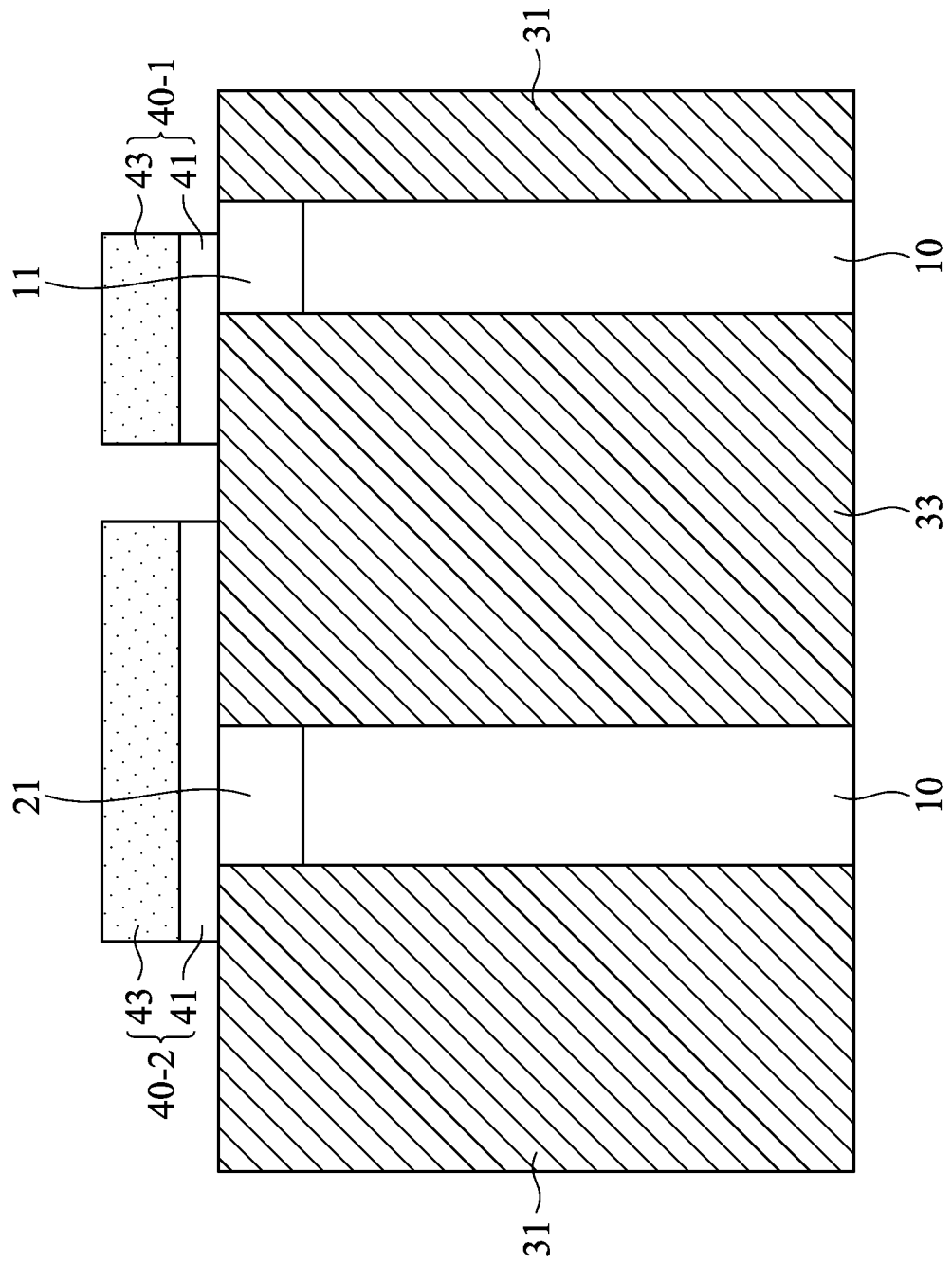
FIG. 2 is a partial cross-sectional view illustrating the semiconductor device along line A-A in FIG. 1.
Figure 3:
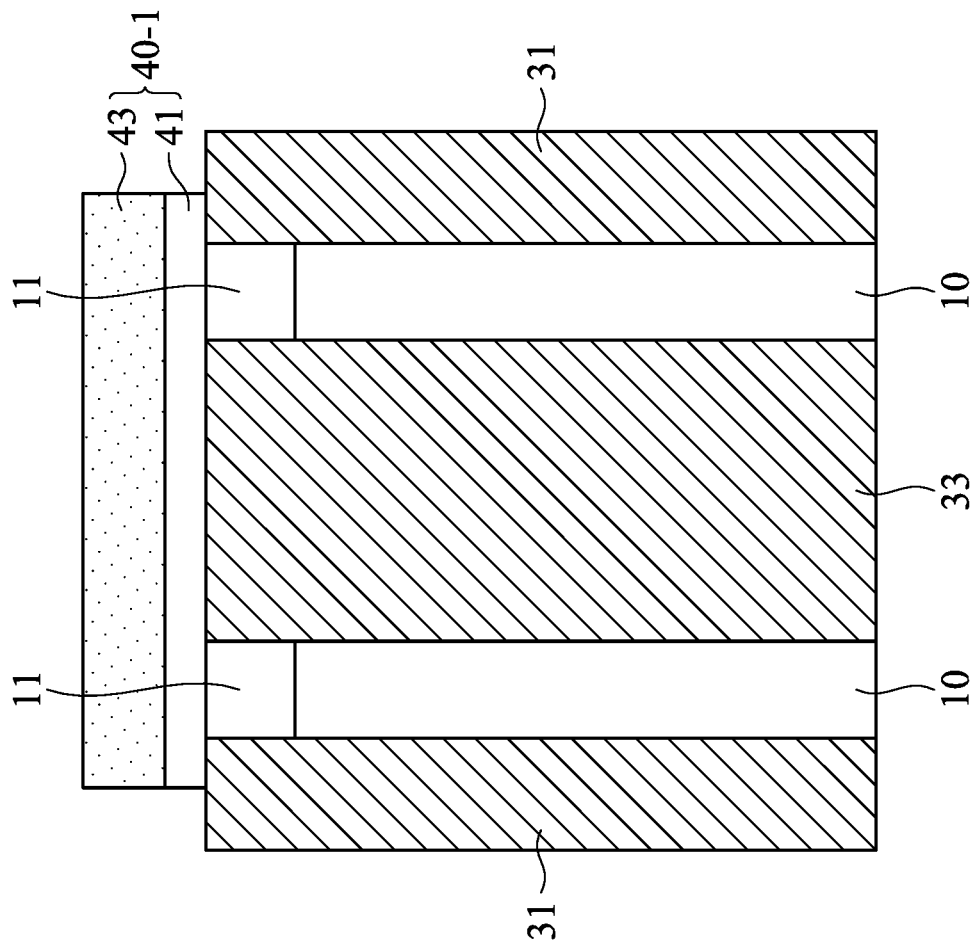
FIG. 3 is a partial cross-sectional view illustrating the semiconductor device along line B-B in FIG. 1.

FIG. 1 is a partial top view illustrating a semiconductor device 100 according to one embodiment of the present disclosure. FIG. 2 is a partial cross-sectional view illustrating the semiconductor device 100 along line A-A in FIG. 1. FIG. 3 is a partial cross-sectional view illustrating the semiconductor device 100 along line B-B in FIG. 1. It should be noted that in order to more clearly show the features of the embodiments of the present invention, some components may be omitted in FIG. 1 to FIG. 3.

Referring to FIG. 1 and FIG. 3, the semiconductor device 100 according to the embodiment of the present disclosure includes a substrate 10. In some embodiments, the substrate 10 may be a silicon substrate, but the embodiment of the present disclosure is not limited thereto. For example, in other embodiments, the substrate 10 may include other elementary semiconductor (e.g., germanium) substrates. In some embodiments, the substrate 10 may include compound semiconductor (e.g., silicon carbide (SiC), gallium arsenic (GaAs), indium arsenide (InAs), or indium phosphide (InP)) substrates, but the embodiment of the present disclosure is not limited thereto. In some embodiments, the substrate 10 may include alloy semiconductor (e.g., silicon germanium (SiGe), silicon germanium carbide (SiGeC), gallium arsenic phosphide (GaAsP), or gallium indium phosphide (GaInP)) substrates, but the embodiment of the present disclosure is not limited thereto.

In some embodiments, the substrate 10 may include a semiconductor-on-insulator (SOI) substrate (e.g., silicon-on-insulator substrate or germanium-on-insulator substrate). The semiconductor-on-insulator substrate may include a bottom substrate, a buried oxide layer disposed on the bottom substrate, and a semiconductor layer disposed on the buried oxide layer. In some embodiments, the substrate 10 may include single-crystal substrates, multi-layer substrates, gradient substrates, other applicable substrates, or a combination thereof, but the embodiment of the present disclosure is not limited thereto.

In this embodiment, the substrate 10 may has a first conductive type. For example, the first conductive type may be P-type, which may include P-type dopants such as boron, aluminum, gallium, indium, and thallium. In some embodiments, the doping concentration (for example, the average doping concentration) of the substrate 10 may be between $10^{10}$ and $10^{16}$ cm$^{-3}$, but the embodiment of the present disclosure is not limited thereto. In other embodiments, the first conductive type may be N-type.

As shown in FIG. 1, the substrate 10 includes a first isolation region 31 disposed along the circumference of the substrate 10. For example, the first isolation region 31 may be used to define an active region and provide electrical isolations required for various device components formed in and/or on the substrate 10 in the active region. In the embodiments of the present disclosure, the first isolation region 31 may be a deep trench isolation (DTI) structure. For example, the depth of the first isolation region 31 may be between 0.1 and 100 μm.

In some embodiments, the formation of the first isolation region 31 (DTI) may include etching a trench in the substrate 10 and filling in the trench with insulating materials (e.g., silicon oxide, silicon nitride, or silicon oxynitride). The filled trench may have a multi-layer structure, such as a thermal oxide liner layer with silicon nitride filling the trench. A chemical mechanical polishing (CMP) process may be performed to polish back excessive insulating materials and planarize the top surface of the first isolation region 31.

In this embodiment, the substrate 10 includes a first implant region 11 and a second implant region 21. The first implant region 11 may have the same (first) conductivity type (e.g., P-type) as the substrate 10, and the second implant region 21 may have a second conductivity type (e.g., N-type) that is the opposite of the first conductivity type. In particular, a suitable process (e.g., ion implantation process) may be used to implant the P-type dopants, such as boron, aluminum, gallium, indium, and thallium, into the first implant region 11 of the substrate 10 in the semiconductor substrate 100 to form the P-type first implant region 11, and a suitable process (e.g., ion implantation process) may be used to implant the N-type dopants, such as nitrogen, phosphorus, arsenic, antimony, bismuth, into the second implant region 21 of the substrate 10 in the semiconductor substrate 100 to form the N-type second implant region 21. For example, first, a suitable implant mask (not shown) may be formed on the substrate 10, and the ion implantation process may be used by the implant mask to form the P-type first implant region 11; then, a suitable implant mask (not shown) may be formed on the substrate 10, and the ion implantation process may be used by the implant mask to form the N-type second implant region 21. The doping concentration of the first implant region 11 may be greater than the doping concentration of the second implant region 21.

As shown in FIG. 1, the semiconductor device 100 further includes a conducting structure 40 disposed on the substrate 10, and at least a portion of the conducting structure 40 may be located on the first isolation region 31. In this embodiment, the second implant region 21 may be divided into a first electrode 211 and a second electrode 213 by the conducting structure 40. In particular, the conducting structure 40 may be divided into a first sub-region 40-1 and a second sub-region 40-2, and the first sub-region 40-1 and the second sub-region 40-2 may be separated from each other. The first sub-region 40-1 of the conducting structure 40 may be disposed on the interface of the first implant region 11 and the second implant region 21, and the second sub-region 40-2 of the conducting structure 40 may divide the second implant region 21 into the first electrode 211 and the second electrode 213.

Referring to FIG. 2 and FIG. 3, the conducting structure 40 (the first sub-region 40-1 and the second sub-region 40-2) may include a dielectric layer 41 and a conductive layer 43 disposed on the dielectric layer 41. In some embodiments, a dielectric material layer (not shown) and a conductive material layer (not shown) disposed thereon may be sequentially blanked (deposited) on the substrate 10, and then the dielectric material layer and the conductive material layer may be patterned by a lithography and etching process to form the dielectric layer 41 and the conductive layer 43 respectively.

In some embodiments, the dielectric material layer (which may be used to form the dielectric layer 41) may be formed of silicon oxide, silicon nitride, silicon oxynitride, high-κ dielectric material, any other suitable dielectric material, or a combination thereof. For example, the high-κ dielectric material may include, LaO, AlO, ZrO, TiO, $Ta_2O_5$, $Y_2O_3$, $SrTiO_3$ (STO), $BaTiO_3$ (BTO), BaZrO, $HfO_2$, $HfO_3$, HfZrO, HfLaO, HfSiO, HfSiON, LaSiO, AlSiO, HfTaO, HfTiO, HfTaTiO, HfAlON, (Ba,Sr) $TiO_3$ (BST), $Al_2O_3$, any other suitable high-κ dielectric material, or a combination thereof. In some embodiments, the dielectric material layer may be formed by chemical vapor deposition (CVD), atomic layer deposition (ALD), spin-on coating, any other applicable process, or a combination thereof. For example, the chemical vapor deposition may include low pressure chemical vapor deposition (LPCVD), low temperature chemical vapor deposition (LTCVD), rapid thermal chemical vapor deposition (RTCVD), or plasma enhanced chemical vapor deposition (PECVD).

In some embodiments, the conductive material layer (which may be used to form the conductive layer 43) may be formed of polycrystalline silicon, but the embodiment of the present disclosure is not limited thereto. In some embodiments, the conductive material layer may be formed of metals (e.g., tungsten, titanium, aluminum, copper, molybdenum, nickel, platinum, the like, or a combination thereof), metal alloys, metal-nitrides (e.g., tungsten nitride, molybdenum nitride, titanium nitride, and tantalum nitride, the like, or a combination thereof), metal-silicides (e.g., tungsten silicide, titanium silicide, cobalt silicide, nickel silicide, platinum silicide, erbium silicide, the like, or a combination thereof), metal-oxides (e.g., ruthenium oxide, indium tin oxide, the like, or a combination thereof), any other applicable material, or a combination thereof. For example, the conductive material layer may be formed by a chemical vapor deposition process, a physical vapor deposition process (e.g., a vacuum evaporation process, or a sputtering process), any other applicable process, or a combination thereof.

In the embodiment shown in FIG. 1 to FIG. 3, the substrate 10 may further include a second isolation region 33. The second isolation region 33 may be disposed inside the region enclosed by the first isolation region 31 and separated from the first isolation region 31. As shown in FIG. 1, the first implant region 11 may be disposed adjacent to the second isolation region 33, and the second implant region 21 may be disposed adjacent to the second isolation region 33 and the first implant region 11. In particular, the first implant region 11 and the second implant region 21 may be disposed between the first isolation region 31 and the second isolation region 32, and the first implant region 11 and the second implant region 21 may enclose the second isolation region 33.

Similarly, the second isolation region 33 may be a deep trench isolation (DTI) structure. For example, the depth of the second isolation region 33 may be between 0.1 and 100 μm. In some embodiments, the formation of the second isolation region 33 (DTI) may include etching a trench in the substrate 10 and filling in the trench with insulating materials (e.g., silicon oxide, silicon nitride, or silicon oxynitride). The filled trench may have a multi-layer structure, such as a thermal oxide liner layer with silicon nitride filling the trench. A chemical mechanical polishing (CMP) process may be performed to polish back excessive insulating materials and planarize the top surface of the second isolation region 33.

In this embodiment, a portion of the first sub-region 40-1 of the conducting structure 40 may be disposed on the first isolation region 31, a portion of the first sub-region 40-1 of the conducting structure 40 may be disposed on the second isolation region 33, a portion of the second sub-region 40-2 of the conducting structure 40 may be disposed on the first isolation region 31, and a portion of the second sub-region 40-2 of the conducting structure 40 may be disposed on the second isolation region 33. In particular, as shown in FIG. 1, both ends of the first sub-region 40-1 of the conductive structure 40 are disposed on the first isolation region 31, and the center of the first sub-region 40-1 is disposed on the second isolation region 33; one end of the second sub-region 40-2 of the conductive structure 40 is disposed on the first isolation region 31, and another end of the second sub-region 40-2 of the conductive structure 40 is disposed on the second isolation region 33, but the embodiment of the present disclosure is not limited thereto.

In some embodiments, the conductive layer 43 of the second sub-region 40-2 of the conductive structure 40 may be used as the gate electrode of the semiconductor device 100, the dielectric layer 41 of the second sub-region 40-2 of the conductive structure 40 may be used as the gate dielectric layer of the semiconductor device 100, the first electrode 211 of the second implant region 21 may be used as the source electrode of the semiconductor device 100, the second electrode 213 of the second implant region 21 may be used as the drain electrode of the semiconductor device 100, and the first implant region 11 may be used as the bulk electrode of the semiconductor device 100, but the embodiment of the present disclosure is not limited thereto. In some embodiments, the first electrode 211 of the second implant region 21 may be used as the drain electrode of the semiconductor device 100, and the second electrode 213 of the second implant region 21 may be used as the source electrode of the semiconductor device 100.

In the embodiment shown in FIG. 1 to FIG. 3, the second sub-region 40-2 of the conductive structure 40 is disposed between the first electrode 211 and the second electrode 213 (between the source electrode and the drain electrode) and both ends of the second sub-region 40-2 of the conductive structure 40 are respectively disposed on the first isolation region 31 and the second isolation region 33; the first sub-region 40-1 of the conductive structure 40 is disposed between the first implant region 11 (bulk electrode) and the second implant region 21 (source/drain electrodes), and both ends of the first sub-region 40-1 of the conductive structure 40 are disposed on the first isolation region 31, and the center of the first sub-region 40-1 is disposed on the second isolation region 33. Since the first isolation region 31 and the second isolation region 33 are deep trench isolation structures, the parasitic capacitance of the semiconductor device 100 may be effectively reduced and the RC delay of the conductive lines may be improved.

Figure 4:
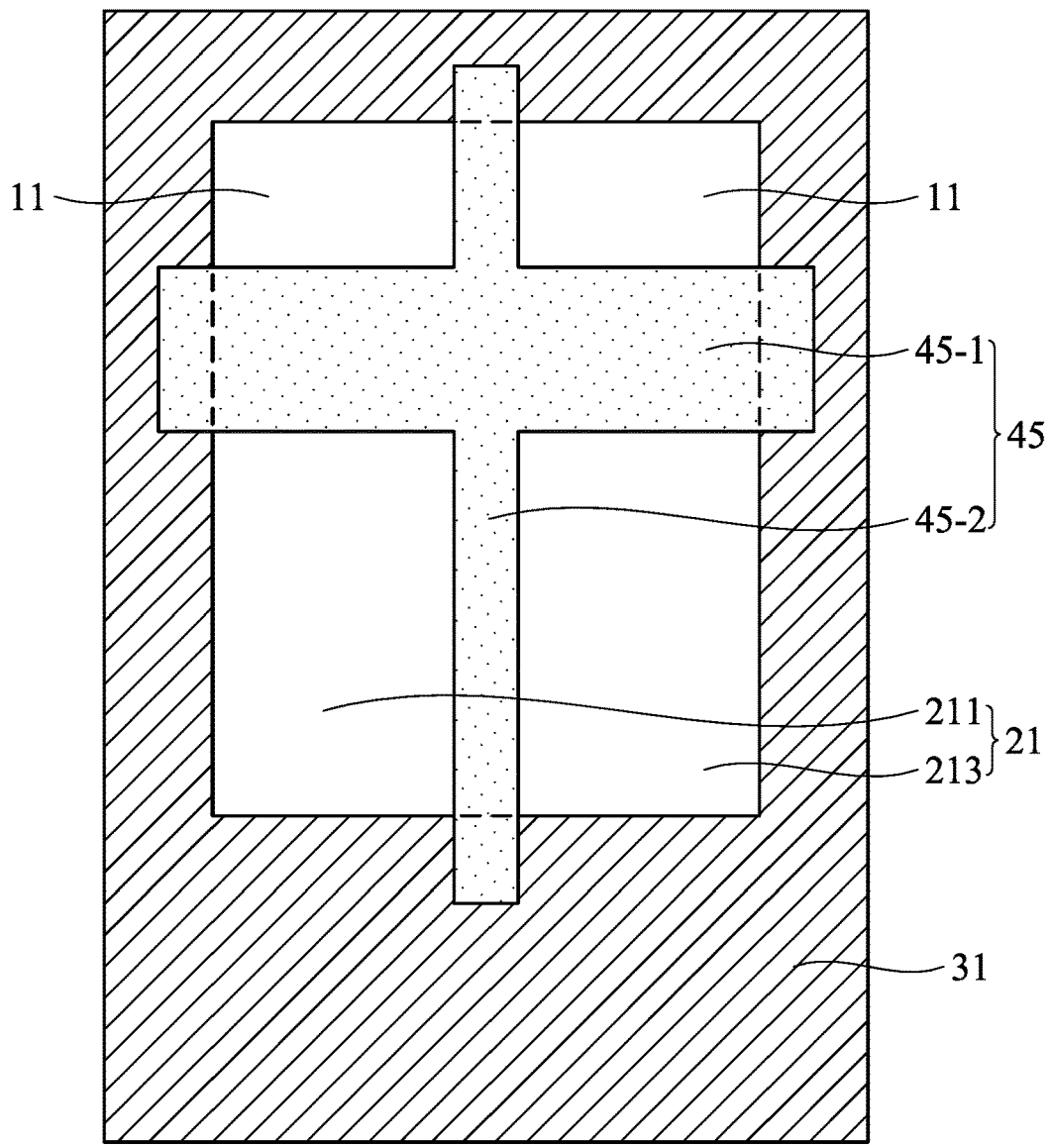
FIG. 4 is a partial top view illustrating a semiconductor device according to another embodiment of the present disclosure.

FIG. 4 is a partial top view illustrating a semiconductor device 101 according to another embodiment of the present disclosure. Similarly, it should be noted that in order to more clearly show the features of the embodiments of the present invention, some components may be omitted in FIG. 4.

As shown in FIG. 4, the semiconductor device 101 according to the embodiment of the present disclosure includes a substrate (not shown in FIG. 4) and a conducting structure 45. The substrate has a first conductivity type (e.g., P-type), and the substrate includes a first isolation region 31, a first implant region 11 and a second implant region 21. In this embodiment, the first isolation region 31 is disposed along the circumference of the substrate; the first implant region 11 has the same first conductivity type (e.g., P-type) as the substrate, and the doping concentration of the first implant region 11 may be greater than the doping concentration of the substrate; the second implant region 21 has a second conductivity type (e.g., N-type) that is the opposite of the first conductivity type; the conducting structure 45 is disposed on the substrate, and at least a portion of the conducting structure 45 is located on the first isolation region 31. In some embodiments, the first isolation region 31 may be a deep trench isolation (DTI) structure, and the conducting structure 45 may include a dielectric layer and a conductive layer disposed on the dielectric layer, and the conductive layer may be, for example, a polycrystalline silicon layer.

In particular, the conducting structure 45 may be divided into a first sub-region 45-1 and a second sub-region 45-2. In this embodiment, the first sub-region 45-1 and the second sub-region 45-2 are connected to each other, and the first sub-region 45-1 and the second sub-region 45-2 are formed as a cross-typed structure, but the embodiment of the present disclosure is not limited thereto. In other embodiments, the first sub-region 45-1 and the second sub-region 45-2 may be formed as a T-shaped structure.

Similarly, the first sub-region 45-1 of the conducting structure 45 may be disposed on the interface of the first implant region 11 and the second implant region 21, and the second sub-region 45-2 of the conducting structure 45 may divide the second implant region 21 into a first electrode 211 and a second electrode 213. In the embodiment shown in FIG. 4, both ends of the first sub-region 45-1 of the conducting structure 45 are disposed on the first isolation region 31; both ends of the second sub-region 45-2 of the conducting structure 45 are disposed on the first isolation region 31. Moreover, as shown in FIG. 4, the second sub-region 45-2 of the conducting structure 45 may divide the first implant region 11 into two regions (electrodes), but the embodiment of the present disclosure is not limited thereto.

Figure 5:
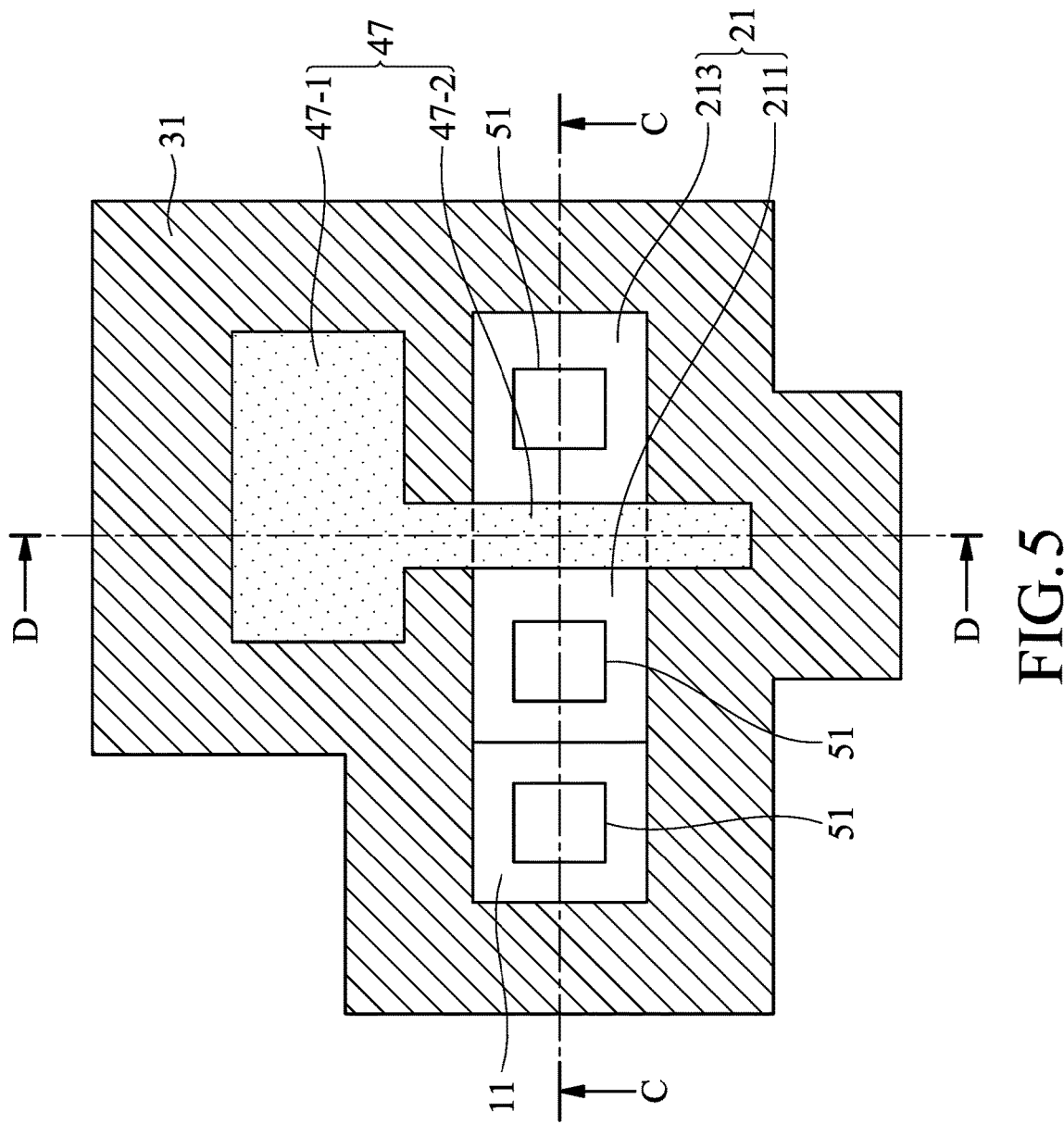
FIG. 5 is a partial top view illustrating a semiconductor device according to one embodiment of the present disclosure.
Figure 6:
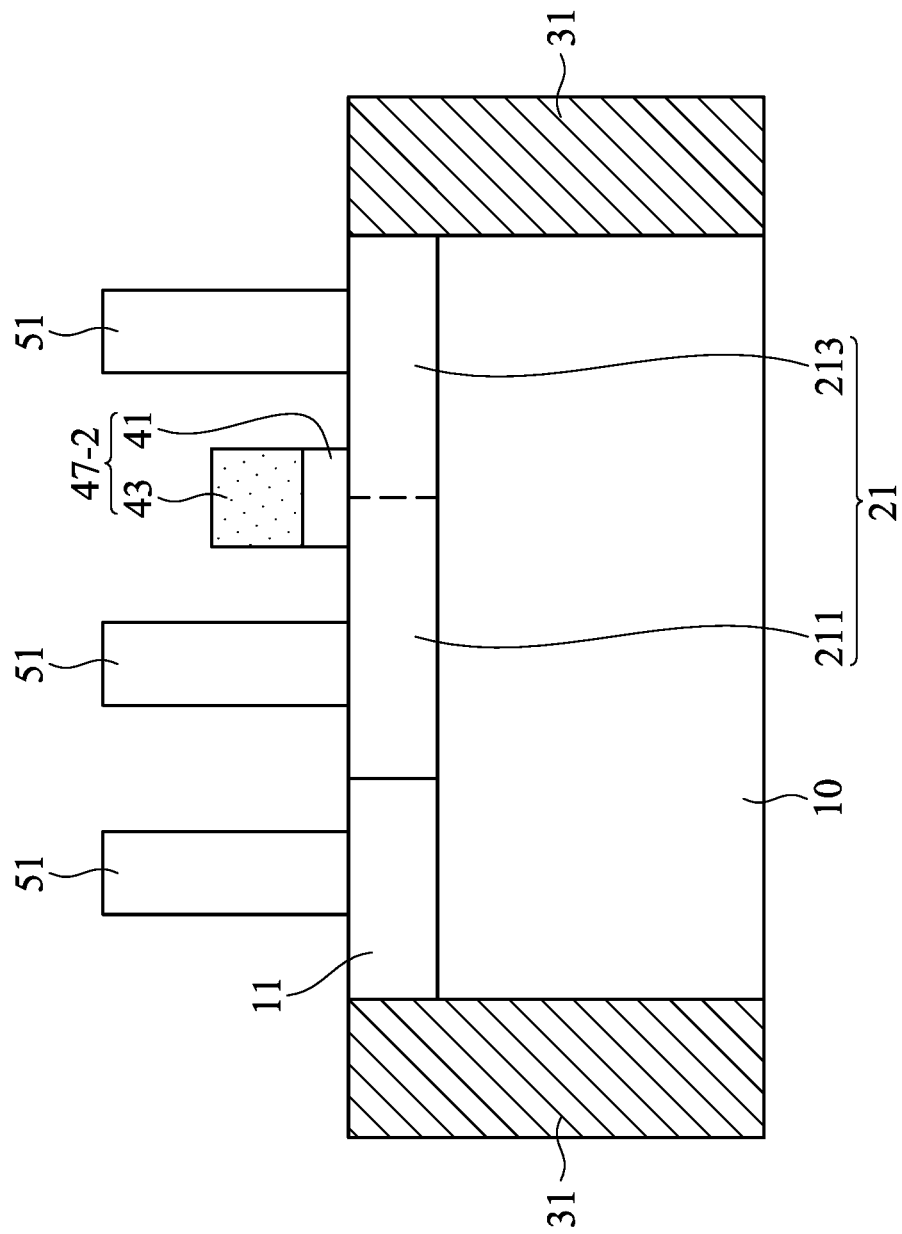
FIG. 6 is a partial cross-sectional view illustrating the semiconductor device along line C-C in FIG. 5.
Figure 7:
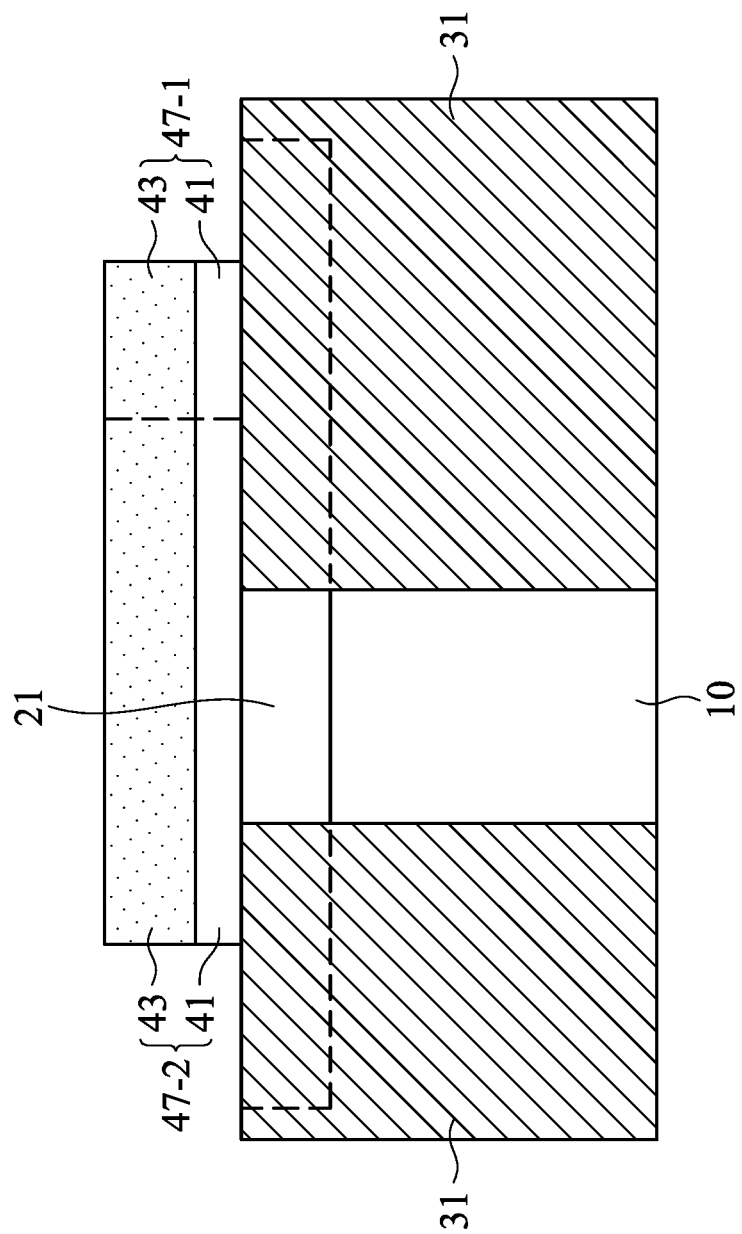
FIG. 7 is a partial cross-sectional view illustrating the semiconductor device along line D-D in FIG. 5.

FIG. 5 is a partial top view illustrating a semiconductor device 102 according to one embodiment of the present disclosure. FIG. 6 is a partial cross-sectional view illustrating the semiconductor device 102 along line C-C in FIG. 5. FIG. 7 is a partial cross-sectional view illustrating the semiconductor device 102 along line D-D in FIG. 5. It should be noted that in order to more clearly show the features of the embodiments of the present invention, some components may be omitted in FIG. 5 to FIG. 7.

Referring to FIG. 5 to FIG. 7, the semiconductor device 102 according to the embodiment of the present disclosure includes a substrate 10 and a conducting structure 47. The substrate 10 has a first conductivity type (e.g., P-type), and the substrate includes a first isolation region 31, a first implant region 11 and a second implant region 21. In this embodiment, the first isolation region 31 is disposed along the circumference of the substrate 10; the first implant region 11 has the same first conductivity type (e.g., P-type) as the substrate 10, and the doping concentration of the first implant region 11 may be greater than the doping concentration of the substrate 10; the second implant region 21 has a second conductivity type (e.g., N-type) that is the opposite of the first conductivity type; the conducting structure 47 is disposed on the substrate 10, and at least a portion of the conducting structure 47 is located on the first isolation region 31. In some embodiments, the first isolation region 31 may be a deep trench isolation (DTI) structure, and the conducting structure 47 may include a dielectric layer 41 and a conductive layer 43 disposed on the dielectric layer, and the conductive layer 43 may be, for example, a polycrystalline silicon layer.

In particular, the conducting structure 47 may be divided into a first sub-region 47-1 and a second sub-region 47-2. In this embodiment, the first sub-region 47-1 and the second sub-region 47-2 are connected to each other, and the first sub-region 47-1 and the second sub-region 47-2 are formed as a T-shaped structure, but the embodiment of the present disclosure is not limited thereto.

In this embodiment, the second sub-region 47-2 of the conducting structure 47 may divide the second implant region 21 into a first electrode 211 and a second electrode 213. As shown in FIG. 5, both ends of the second sub-region 47-2 of the conducting structure 47 are disposed on the first isolation region 31. Moreover, in this embodiment, the first implant region 11 may be disposed adjacent to the second implant region 21. In particular, referring to FIG. 5 and FIG. 6, the first implant region 11 may be disposed adjacent to the first electrode 211 of the second implant region 21, and the first electrode 211 of the second implant region 21 may be disposed adjacent to the second electrode 213 of the second implant region 21. That is, the first electrode 211 of the second implant region 21 may be located between the first implant region 11 and the second electrode 213 of the second implant region 21.

In the embodiment shown in FIG. 5 to FIG. 7, (the conductive layer 43 of) the second sub-region 47-2 of the conducting structure 47 may be used as the gate electrode of the semiconductor device 102, the first electrode 211 of the second implant region 21 may be used as the source electrode of the semiconductor device 102, the second electrode 213 of the second implant region 21 may be used as the drain electrode of the semiconductor device 102, and the first implant region 11 may be used as the bulk electrode of the semiconductor device 102, but the embodiment of the present disclosure is not limited thereto.

In the embodiment shown in FIG. 5 to FIG. 7, a plurality of contacts 51 are further shown, and the contacts 51 may be disposed on the first implant region 11 (bulk electrode), the first electrode 211 of the second implant region 21 (source electrode) and the second electrode 213 of the second implant region 21 (drain electrode) of the semiconductor device 102. It should be noted that the number and the locations of the contacts 51 are not limited to the embodiment shown in FIG. 5 to FIG. 7. For example, in some embodiments, the plurality of contacts 51 may be disposed on the first sub-region 47-1, which depends on demand.

Figure 8:
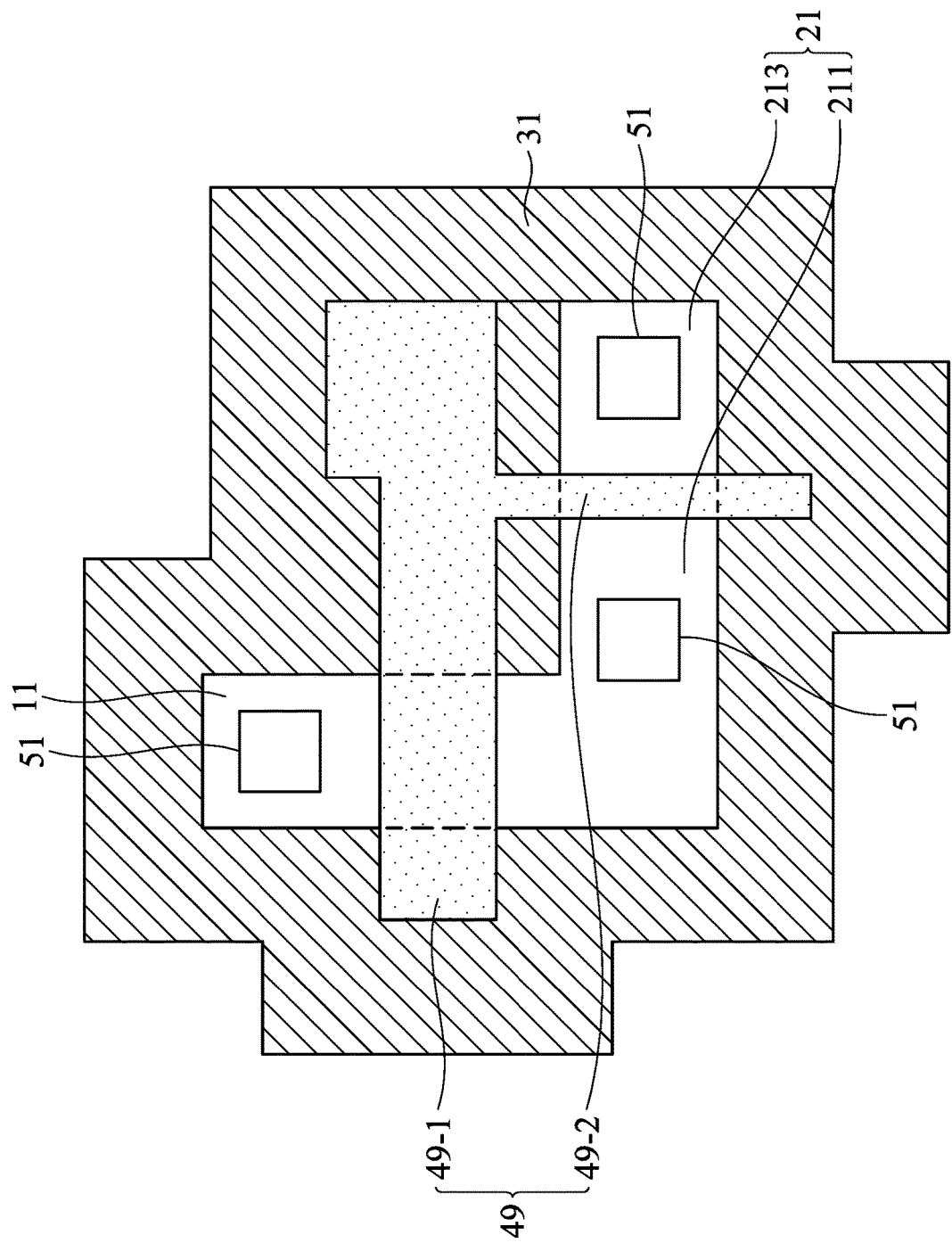
FIG. 8 is a partial top view illustrating a semiconductor device according to another embodiment of the present disclosure.

FIG. 8 is a partial top view illustrating a semiconductor device 103 according to another embodiment of the present disclosure. Similarly, it should be noted that in order to more clearly show the features of the embodiments of the present invention, some components may be omitted in FIG. 8.

As shown in FIG. 8, the semiconductor device 103 according to the embodiment of the present disclosure includes a substrate (not shown in FIG. 8) and a conducting structure 49. The substrate has a first conductivity type (e.g., P-type), and the substrate includes a first isolation region 31, a first implant region 11 and a second implant region 21. In this embodiment, the first isolation region 31 is disposed along the circumference of the substrate; the first implant region 11 has the same first conductivity type (e.g., P-type) as the substrate, and the doping concentration of the first implant region 11 may be greater than the doping concentration of the substrate; the second implant region 21 has a second conductivity type (e.g., N-type) that is the opposite of the first conductivity type; the conducting structure 49 is disposed on the substrate, and at least a portion of the conducting structure 49 is located on the first isolation region 31. In some embodiments, the first isolation region 31 may be a deep trench isolation (DTI) structure, and the conducting structure 49 may include a dielectric layer and a conductive layer disposed on the dielectric layer, and the conductive layer may be, for example, a polycrystalline silicon layer.

In particular, the conducting structure 49 may be divided into a first sub-region 49-1 and a second sub-region 49-2. In this embodiment, the first sub-region 49-1 and the second sub-region 49-2 are connected to each other, and the first sub-region 49-1 and the second sub-region 49-2 are formed substantially as a T-shaped structure, but the embodiment of the present disclosure is not limited thereto. In other embodiments, the first sub-region 49-1 and the second sub-region 49-2 may be in other shapes, which depend on demand.

Similarly, the first sub-region 49-1 of the conducting structure 49 may be disposed on the interface of the first implant region 11 and the second implant region 21, and the second sub-region 49-2 of the conducting structure 49 may divide the second implant region 21 into a first electrode 211 and a second electrode 213. In the embodiment shown in FIG. 8, both ends of the first sub-region 49-1 of the conducting structure 49 are disposed on the first isolation region 31; both ends of the second sub-region 49-2 of the conducting structure 49 are disposed on the first isolation region 31.

Moreover, as shown in FIG. 8, the first implant region 11 and the second implant region 21 may be formed as an L-shaped structure in this embodiment. In particular, the first implant region 11 may be disposed adjacent to the first electrode 211 of the second implant region 21, and the extending direction of the first implant region 11 may be perpendicular to the extending directions of the first electrode 211 and the second electrode 213 of the second implant region 21, but the embodiment of the present disclosure is not limited thereto.

It should be noted that although the foregoing embodiments are described in which the first conductivity type is P-type and the second conductivity type is N-type, but the embodiments of the present invention are not limited thereto. In some embodiments, the first conductivity type may be N-type and the second conductivity type may be P-type.

In summary, in the semiconductor device according to the embodiment of the present disclosure, a plurality of electrodes (e.g., source/drain electrodes, bulk electrode) may be separated from each other by the conducting structure (which includes a conductive layer and a dielectric layer), and a portion of the conducting structure (e.g., the end(s) of the conducting structure) is disposed on the isolation region (e.g., DTI structure). Therefore, the parasitic capacitance of the semiconductor device may be effectively reduced and the RC delay of the conductive lines may be improved.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:
1. A semiconductor device, comprising:
   a substrate having a first conductivity type, and comprising:
     a first isolation region disposed along a circumference of the substrate;
     a first implant region having the first conductivity type; and
     a second implant region having a second conductivity type that is the opposite of the first conductivity type; and
   a conducting structure disposed on the substrate, and at least a portion of the conducting structure is located on the first isolation region, wherein the conducting structure is divided into a first sub-region and a second sub-region, and the second implant region is divided into a first electrode and a second electrode by the second sub-region.

2. The semiconductor device according to claim 1, wherein the first isolation region is a deep trench isolation structure.

3. The semiconductor device according to claim 2, wherein the conducting structure comprises:
a dielectric layer; and
a conductive layer disposed on the dielectric layer.

4. The semiconductor device according to claim 3, wherein the conductive layer is a polycrystalline silicon layer.

5. The semiconductor device according to claim 1, wherein the first sub-region is disposed on an interface of the first implant region and the second implant region.

6. The semiconductor device according to claim 5, wherein the first implant region and the second implant region are formed as an L-shaped structure.

7. The semiconductor device according to claim 1, wherein the first sub-region and the second sub-region are connected to each other.

8. The semiconductor device according to claim 7, wherein the first sub-region and the second sub-region are formed as a cross-typed structure or a T-shaped structure.

9. The semiconductor device according to claim 1, wherein the first sub-region and the second sub-region are separated from each other.

10. The semiconductor device according to claim 9, wherein the substrate further comprises a second isolation region that is disposed inside a region enclosed by the first isolation region and is separated from the first isolation region.

11. The semiconductor device according to claim 10, wherein a portion of the first sub-region is disposed on the first isolation region, a portion of the first sub-region is disposed on the second isolation region, a portion of the second sub-region is disposed on the first isolation region, and a portion of the second sub-region is disposed on the second isolation region.

12. The semiconductor device according to claim 11, wherein the second isolation region is a deep trench isolation structure.

13. The semiconductor device according to claim 1, wherein the first conductivity type is P-type, and the second conductivity type is N-type.

14. The semiconductor device according to claim 1, wherein the first conductivity type is N-type, and the second conductivity type is P-type.

15. A semiconductor device, comprising:
a substrate, comprising:
a first isolation region disposed along a circumference of the substrate;
a second isolation region disposed inside a region enclosed by the first isolation region, wherein the second isolation region is separated from the first isolation region;
a first implant region disposed adjacent to the second isolation region; and
a second implant region disposed adjacent to the second isolation region and the first implant region; and
a conducting structure disposed on the substrate, and at least a portion of the conducting structure is located on the first isolation region and the second isolation region.

16. The semiconductor device according to claim 15, wherein the substrate has a first conductivity type, the first implant region has the first conductivity type, the second implant region has a second conductive type that is the opposite of the first conductivity type.

17. The semiconductor device according to claim 15, wherein the first isolation region and the second isolation region are deep trench isolation structures.

18. The semiconductor device according to claim 15, wherein the conducting structure comprises a first sub-region and a second sub-region separated from each other, the first sub-region is disposed on an interface of the first implant region and the second implant region, and the second sub-region divides the second implant region into a first electrode and a second electrode.

* * * * *